(12) United States Patent
Ma et al.

(10) Patent No.: US 12,262,169 B2
(45) Date of Patent: Mar. 25, 2025

(54) BONE CONDUCTION SOUND GENERATING BASED LOLLIPOP, PROCESSING METHOD AND SYSTEM THERETO

(71) Applicant: THUNDER BLAST TECHNOLOGY CO., LIMITED, Hong Kong (CN)

(72) Inventors: Lei Ma, Hong Kong (CN); Jia Hong Ma, Hong Kong (CN); Mi Le Zhang, Hong Kong (CN); Yau Ming Chiu, Hong Kong (CN)

(73) Assignee: THUNDER BLAST TECHNOLOGY CO., LIMITED, Hong Kong (CN)

( * ) Notice: Subject to any disclaimer, the term of this patent is extended or adjusted under 35 U.S.C. 154(b) by 201 days.

(21) Appl. No.: 18/074,017

(22) Filed: Dec. 2, 2022

(65) Prior Publication Data
US 2023/0103396 A1    Apr. 6, 2023

Related U.S. Application Data

(63) Continuation of application No. PCT/CN2020/093930, filed on Jun. 2, 2020.

(51) Int. Cl.
*H04R 1/10* (2006.01)
*A23G 3/56* (2006.01)
*G11C 7/16* (2006.01)

(52) U.S. Cl.
CPC ............ *H04R 1/1091* (2013.01); *A23G 3/56* (2013.01); *G11C 7/16* (2013.01); *H04R 2460/13* (2013.01)

(58) Field of Classification Search
CPC .... H04R 2460/13; H04R 1/1091; A23G 3/56; A23G 3/563; G11C 7/16
(Continued)

(56) References Cited

U.S. PATENT DOCUMENTS

2009/0226011 A1    9/2009  Abolfathi

FOREIGN PATENT DOCUMENTS

CN    201393517 Y    2/2010
CN    202600854 U    12/2012
(Continued)

OTHER PUBLICATIONS

First Office Action of the parallel application JP2022-574540.
International Search Report of PCT/CN2020/093930.

*Primary Examiner* — Norman Yu
(74) *Attorney, Agent, or Firm* — J.C. Patents

(57) ABSTRACT

The present disclosure provides a bone conduction based sound generating lollipop, a processing method and a system thereto. The bone conduction based sound generating lollipop includes a housing, a trigger, a controller and a sound generating component. The sound generating component, the controller and the trigger are integrated in a packaging cavity formed by the housing, and a separate packaging of the sound generating component is eliminated. When a supporting component of the housing enters a human oral cavity, the trigger sends an opening instruction to the controller, the controller drives the sound generating component to vibrate, and then a vibration signal is transmitted to a human auditory system in a bone conduction manner after passing through the supporting component of the housing and an edible object attached to the supporting component, and passing through an oral tissue or teeth of the human body.

42 Claims, 7 Drawing Sheets

(58) Field of Classification Search
USPC .......................................... 381/151, 326, 380
See application file for complete search history.

(56) References Cited

FOREIGN PATENT DOCUMENTS

| | | | |
|---|---|---|---|
| CN | 203538273 U | | 4/2014 |
| CN | 203722822 U | | 7/2014 |
| CN | 110197678 | * | 9/2019 |
| CN | 110197678 A | | 9/2019 |
| JP | H1190053 A | | 4/1999 |
| JP | 2000175280 A | * | 6/2000 |
| JP | 2019109314 | * | 7/2019 |
| WO | WO 9923854 | * | 5/1999 |

* cited by examiner

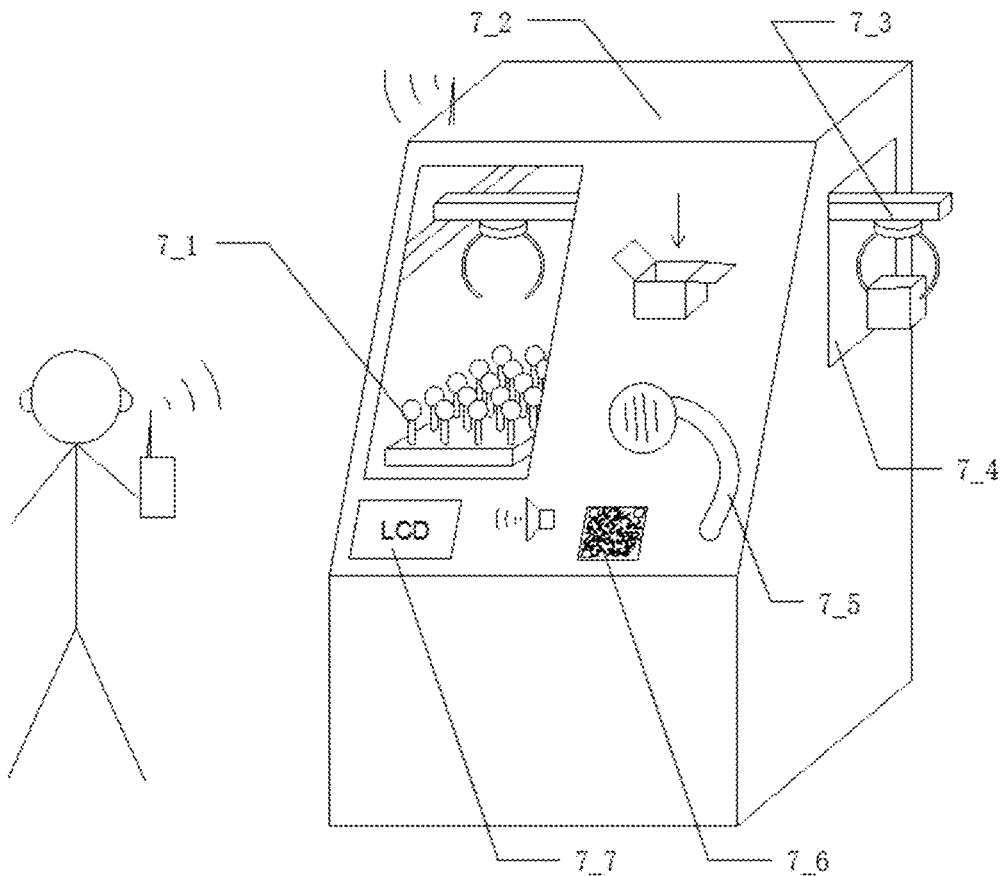

FIG. 7

| Receiving, by a controller, an opening instruction through a trigger, or determining whether a lollipop enters an oral cavity of an object to be sounded or touches teeth through the trigger | ~ S101 |

| Driving, by the controller, a sound generating component to generate a vibration signal when the controller determines that the opening instruction is received, or determines that the lollipop enters the oral cavity of the object to be transmitted or touches the teeth through the trigger, to transmit the vibration signal to an auditory system of the object to be sounded through at least one supporting component and the lollipop | ~ S102 |

FIG. 8

BONE CONDUCTION SOUND GENERATING BASED LOLLIPOP, PROCESSING METHOD AND SYSTEM THERETO

CROSS-REFERENCE TO RELATED APPLICATIONS

This application is a continuation of International Application No. PCT/CN2020/093930, filed on Jun. 2, 2020, the disclosure of which is hereby incorporated by reference in its entirety.

TECHNICAL FIELD

The present application relates to the field of bone conduction technology, in particular to a bone conduction sound generating based lollipop, a processing method and a system thereto.

BACKGROUND

With an improvement about material standards of living about people, a new type of candy, which is named sound generating lollipops, has gradually emerged, which is different from traditional candies. The sound generating lollipop usually uses a sound generating stick handle to replace an original lollipop rod. A sugar body is directly attached to one end of the stick handle, and a sound generating component is located at the other end of the stick handle.

A speaker of the traditional sound generating lollipop is a general horn, and sound played will be heard by a user and all people around, which is easy to disturb the people around, and is not conducive for the users to protect their privacies, so that corresponding products are of low grade and user experiences are poor.

However, when directly applying existing bone conduction sound generating technology into the sound generating lollipop, defects such as narrow frequency domain, high distortion, large attenuation at low and high frequencies and high power consumption of existing bone conduction vibration sound generating components are highlighted. A traditional air horn solves the above problem by adding horns with different frequency characteristics to form a space coverage network with surrounding horns, that is, multiple horns with high and low frequencies forming a stereo surround to improve a sound quality. However, when the same method is applied to the sound generating lollipop using the bone conduction, it will be severely restricted by a volume and installation space of the lollipop. Increasing an amount of the bone conduction sound generating components will greatly increase the volume and weight of the lollipop, and even makes the lollipop cannot be put into to mouth, which makes a sound leakage of a bone conduction device become serious, lose a significance of using the bone conduction to generate sound, and finally led to a problem of poor sound quality of the bone conduction sound generating lollipop.

SUMMARY

A technical problem to be solved by the present disclosure is how to improve a sound quality of a bone conduction based sound generating lollipop that can be put into the mouth, and avoid excessive volume and weight of the sound generating lollipop.

In a first aspect, an embodiment of the present disclosure provides a bone conduction based sound generating lollipop, including: a housing, a trigger, a controller and a sound generating component; where, the housing includes at least one supporting component, configured to support the lollipop; and the controller is configured to drive the sound generating component to generate a vibration signal according to an opening instruction received by the trigger, or when the trigger determines that the lollipop enters an oral cavity of an object to be sounded or touches teeth, to transmit the vibration signal to an auditory system of the object to be sounded through the at least one supporting component and the lollipop.

In one possible design, the trigger includes a sensor;

then the controller is specifically configured to trigger the sound generating component to generate the vibration signal when the sensor determines that the lollipop enters a human oral cavity.

In an implementation, the sensor includes a pressure sensor, then the controller is specifically configured to trigger the sound generating component to generate the vibration signal according to a pressure change generated by touching the lollipop sensed by the pressure sensor.

In an implementation, the sensor includes a light sensor, then the controller is specifically configured to trigger the sound generating component to generate the vibration signal according to a light change around the lollipop sensed by the light sensor.

In an implementation, the sensor comprises one or a combination of several of the following: a temperature sensor, a humidity sensor and a capacitance sensor;

then the controller is specifically configured to trigger the sound generating component to generate the vibration signal according to a temperature, humidity and/or capacitance change around the lollipop sensed by the temperature sensor, humidity sensor and/or capacitance sensor.

In a possible design, the controller is further configured to perform operation on a sound source using an operation mode corresponding to a preset times, when the pressure sensor recognizes that times of teeth of the human oral cavity of touching the lollipop within a preset interval range reaches the preset time.

In an implementation, the operation mode includes one or more of the following:

a fast forward operation, a fast backward operation, an operation of skipping to next audio program, an operation of skipping to previous audio program, an operation of reducing preset volume and an operation of increasing preset volume.

Further, in an implementation, the controller is further configured to reduce a volume of a sound source when the pressure sensor recognizes that a pressure change range of touching the lollipop is greater than a preset threshold range.

In one possible design, any one of the bone conduction based sound generating lollipop further includes: a timer;

then the controller is further configured to record a time of the lollipop in the oral cavity using the timer when the lollipop is determined to enter a human oral cavity; and the controller is further configured to determine a melting degree of the lollipop according to the time of the lollipop in the oral cavity recorded by the timer, and adjust a volume of a sound source according to the melting degree.

In a possible design, the housing also includes a handle shaped component, and the handle shaped component is connected with the supporting component;

the sound generating component is arranged in the supporting component, and the controller is arranged in the handle shaped component.

In an implementation, the handle shaped component includes a connecting section, a system section and a sound leak-proof structure or a sound leak-proof material attached to an inner cavity wall of the handle shaped component; where, one end of the connecting section is connected with the supporting component, and the other end is connected with the system section; and the controller is arranged in the system section.

In an implementation, the sound generating component includes an external structure and at least one energy conversion unit accommodated in the external structure.

In a possible design, the energy conversion unit includes an electric receiving element connected to the external structure and a vibration element within an action range of the electric receiving element.

In an implementation, when there is at least one energy conversion unit:
the electric receiving element in each energy conversion unit includes a first magnetic body, and the vibration element includes one second magnetic body or two second magnetic bodies;
or,
the electric receiving element in each energy conversion units includes two first magnetic bodies, and the vibration element includes one second magnetic body.

In an implementation, the first magnetic body or the second magnetic body includes at least one magnet and/or at least one coil.

In a possible design, the energy conversion unit further includes an elastic element, configured to implement a connection between the electric receiving element and the vibration element.

In one possible design, when there is at least one energy conversion unit, the electric receiving element in each energy conversion unit includes a vibration diaphragm, and the vibration element includes at least one piezoelectric sheet.

In an implementation, for each energy conversion unit, one piezoelectric sheet is attached to a middle of the vibration diaphragm, and the other piezoelectric sheets are respectively attached to sides of the vibration diaphragm.

In one possible design, when there is at least two energy conversion units, the external structure is further provided with at least two accommodating cavities, so that each of the accommodating cavities accommodates one of the energy conversion units.

In one possible design, the controller is specifically configured to drive all or part of the energy conversion unit in the sound generating component to generate the vibration signal according to a type of an acquired sound source and a frequency response range corresponding to the energy conversion unit.

In an implementation, the frequency response range corresponding to each energy conversion unit is different.

In an implementation, each energy conversion unit includes at least one different frequency response range.

In one possible design, according to any one of the bone conduction based sound generating lollipop as described above, the trigger includes a switching element, the controller is specifically configured to determine that the opening instruction is received according to an opening of the switching element, to trigger the sound generating element to generate the vibration signal.

In one possible design, according to any one of the bone conduction based sound generating lollipop as described above, the bone conduction based sound generating lollipop further includes a power supplier, configured to perform a power supply processing to the controller and the sound generating component.

In one possible design, according to any one of the bone conduction based sound generating lollipop as described above, the bone conduction based sound generating lollipop further includes:
at least one indicator light;
then the controller is specifically configured to start the at least one indicator light while the controller triggers the sound generating component to generate the vibration signal.

In one possible design, according to any one of the bone conduction based sound generating lollipop as described above, the bone conduction based sound generating lollipop further includes at least one light-emitting apparatus;
then the controller is specifically configured to trigger the at least one light-emitting apparatus to emit light with at least one color and/or light intensity according to a type of a sound source and/or a strength of the vibration signal.

In one possible design, according to any one of the bone conduction based sound generating lollipop as described above, the bone conduction based sound generating lollipop further includes a memory, configured to store sound source data.

In one possible design, according to any one of the bone conduction based sound generating lollipop as described above, the bone conduction based sound generating lollipop further includes a data input interface, configured to receive a sound source sent by an external device in a wired and/or wireless manner.

In one possible design, according to any one of the bone conduction based sound generating lollipop as described above, the data input interface includes at least one of USB interface, eSATA interface, SD card interface, Micro SD card interface, audio input interface, video input interface, Wi-Fi interface, Bluetooth interface, metal electrode and microphone.

In one possible design, according to any one of the bone conduction based sound generating lollipop as described above, the bone conduction based sound generating lollipop further includes a recognition chip, configured to establish a communication connection with an external device, and perform a verification interaction processing with the external devices.

In a second aspect, an embodiment of the present disclosure provides a bone conduction based sound generating lollipop system, including any one of the bone conduction based sound generating lollipop as described above, and a device carries the bone conduction based sound generating lollipop.

In one possible design, the device includes an accommodating box for accommodating the bone conduction based sound generating lollipop, a transmission apparatus for transmitting the bone conduction based sound generating lollipop arranged inside the accommodating box, an outlet arranged in an external side of the accommodating box, a control apparatus arranged inside the accommodating box and a display screen arranged in the external side of the accommodating box for interaction;
then the control apparatus is configured to trigger the transmission apparatus to take out the bone conduction based sound generating lollipop matched with a lollipop request instruction from the accommodating box when obtaining the lollipop request instruction based on the display screen for interaction, and transmit the matched bone conduction based sound generating lollipop to the outlet.

In one possible design, the device includes an accommodating box for accommodating the bone conduction based sound generating lollipop, a transmission apparatus for transmitting the bone conduction based sound generating lollipop arranged inside the accommodating box, an outlet arranged in an external side of the accommodating box, a control apparatus arranged inside the accommodating box, and an operating lever apparatus for interaction;

then the control apparatus is configured to trigger the transmission apparatus to take out the bone conduction based sound generating lollipop matched with a lollipop request instruction from the accommodating box when obtaining the lollipop request instruction based on the operating lever apparatus for interaction, and transmit the matched bone conduction based sound generating lollipop to the outlet.

In an implementation, the device further includes a burning apparatus, and then the control apparatus is specifically configured to burn information to be burned in an acquired information burning request into a memory of the bone conduction based sound generating lollipop according to the information burning request.

In one possible design, the information to be burned includes one or a combination of several of the following: music to be burned, voice to be burned, and electronic ticket to be burned.

In a third aspect, an embodiment of the present disclosure provides a bone conduction based sound generating lollipop processing method, where the method is applied to the bone conduction based sound generating lollipop described in any one of the first aspect, and the method includes:

receiving, by a controller, an opening instruction through a trigger, or determining whether the lollipop enters an oral cavity or touches teeth of an object to be sounded through the trigger; and driving, by the controller, a sound generating component to generate a vibration signal when the controller determines that the opening instruction is received, or determines that the lollipop enters the oral cavity or touches the teeth of the object to be sounded through the trigger, to transmit the vibration signal to an auditory system of the object to be sounded through at least one supporting component and the lollipop.

In an implementation, the controller triggers the sound generating component to generate the vibration signal when the sensor determines that the lollipop enters a human oral cavity.

In one possible design, according to any one of the bone conduction based sound generating lollipop processing method as described above, when the sensor includes a pressure sensor, the controller triggers the sound generating component to generate the vibration signal according to a pressure change generated by touching the lollipop sensed by the pressure sensor.

In one possible design, according to any one of the bone conduction based sound generating lollipop processing method as described above, when the sensor includes a light sensor, the controller triggers the sound generating component to generate the vibration signal according to a light change around the lollipop sensed by the light sensor.

In one possible design, according to any one of the bone conduction based sound generating lollipop processing method as described above, when the sensor includes one or a combination of several of the following: a temperature sensor, a humidity sensor and a capacitance sensor, the controller triggers the sound generating component to generate the vibration signal according to a temperature, humidity and/or capacitance change around the lollipop sensed by the temperature, humidity and/or capacitance sensor.

In an implementation, the controller operates a sound source using an operation mode corresponding to a preset times, when the times of touching the lollipop by the teeth in the human oral cavity touch within a preset interval range reaches the preset time sensed by the pressure sensor.

In an implementation, the operation mode includes one or more of the following:

a fast forward operation, a fast backward operation, an operation of skipping to next audio program, an operation of skipping to previous audio program, an operation of reducing preset volume and an operation of increasing preset volume In one possible design, the controller reduces a volume of a sound source when the pressure sensor recognizes that a pressure change range of touching the lollipop is greater than a preset threshold range.

In one possible design, according to any one of the bone conduction based sound generating lollipop processing method as described above, the method further includes:

recording, by the controller, a time of the lollipop in the oral cavity using the timer when the lollipop is determined to enter a human oral cavity; and determining, by the controller, a melting degree of the lollipop according to the time of the lollipop in the oral cavity recorded by the timer, and adjusting a volume of a sound source according to the melting degree.

The present disclosure provides the bone conduction based sound generating lollipop, the processing method and the system thereto. The bone conduction based sound generating lollipop includes the housing, the trigger, the controller and the sound generating component. The sound generating component, the controller and the trigger are integrated in a packaging cavity formed by the housing, and a separate packaging of the sound generating component is eliminated. When a supporting component of the housing enters the human oral cavity, the trigger sends the opening instruction to the controller, the controller drives the sound generating component to vibrate, and then the vibration signal is transmitted to a human auditory system in a bone conduction manner after passing through the supporting component of the housing and an edible object attached to the supporting component, and passing through an oral tissue or teeth of the human body. Compared with an existing bone conduction sound generating lollipop, the packaging housing of a traditional sound generating structure is eliminated or reduced, making a structure of a bone conduction sound generating component simple and highly integrated, thereby a miniaturization of the bone conduction based sound generating lollipop is achieved, and a sound quality loss of the device is reduced, and thus improving the sound quality.

BRIEF DESCRIPTION OF DRAWINGS

In order to more clearly explain technical solutions in embodiments of the present disclosure or in the prior art, the following will briefly introduce drawings needed to be used when describing the embodiments or the prior art. Obviously, the drawings in the following description are some embodiments of the present disclosure. For those skilled in the art, they can also obtain other drawings based on these drawings without paying creative labor.

FIG. 7 is a structural diagram of a bone conduction based sound generating lollipop system provided by yet another embodiment of the present disclosure.

FIG. 8 is a flow diagram of a bone conduction based sound generating lollipop processing method provided by an embodiment of the present disclosure.

Figure 1:
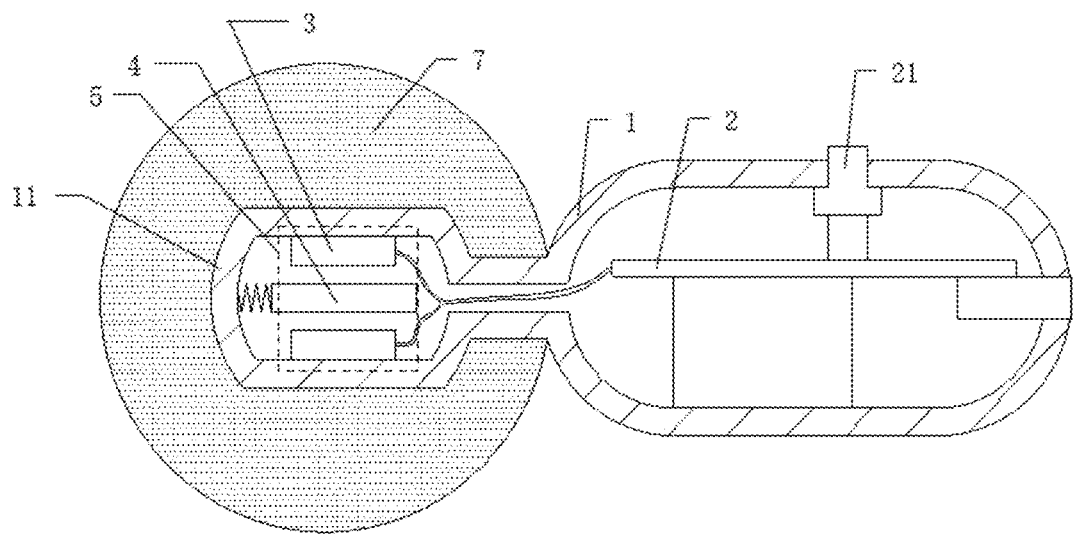
FIG. 1 is a structural diagram of a bone conduction based sound generating lollipop provided by an embodiment of the present disclosure.

Through the above drawings, clear embodiments of the present disclosure have been shown, and will be described in more detail later. These drawings and text descriptions are not intended to limit a scope of concept of the present disclosure in any way, but to explain the concept of the present disclosure for those skilled in the art by referring to specific embodiments.

DESCRIPTION OF EMBODIMENTS

In order to make a purpose, a technical scheme and advantages of embodiments of the present disclosure more clear, the technical scheme in the embodiments of the present disclosure will be described clearly and completely below in combination with drawings of the embodiments of the present disclosure. Obviously, the described embodiments are part of the embodiments of the present disclosure, not all of them. Based on the embodiments of the present disclosure, all other embodiments obtained by those skilled in the art without creative work belong to a scope of the present disclosure.

The terms "first", "second", "third", "fourth" and the like (if any) in the description and claims of the present disclosure and the above drawings are used to distinguish similar objects, and need not be used to describe a specific order or sequence. It should be understood that data used in such manner can be interchanged where appropriate, so that embodiments of the present disclosure described herein can be implemented, for example, in an order other than those illustrated or described herein. In addition, the terms "include" and "have" and any variations thereof are intended to cover non-exclusive inclusion. For example, a process, method, system, product or equipment that contains a series of steps or units need not be limited to those steps or units that are clearly listed, but can include other steps or units that are not clearly listed or are inherent to these processes, methods, products or equipment.

The technical scheme of the present disclosure and how the technical scheme of the present application solves the above technical problems are described in detail below with specific embodiments. The following specific embodiments can be combined with each other, and the same or similar concepts or processes may not be repeated in some embodiments. The embodiments of the present disclosure will be described below in combination with the drawings.

In the prior art, a bone conduction based sound generating lollipop is limited by defects such as narrow frequency domain, high distortion, large attenuation in low frequency and high frequency and high power consumption of an existing bone conduction vibration sound generating components. In addition, the existing bone conduction vibration sound generating components are independently packaged, with a layer of packaging housing, and a rod itself of the lollipop also has a layer of external housing, which increases a transmission route of vibration. That is to say, the packaging housing causes a loss of some frequencies in a vibration frequency domain, which leads to a decline of a sound quality. Moreover, due to an existence of the packaging housing, although the existing bone conduction based sound generating lollipop can improve the sound quality by setting multiple bone conduction sound generating devices, an amount, a volume and a weight of the required equipment will greatly increase, and the volume will further increase to a point that it is difficult for users to put the lollipop into the mouth; however, cannot put the lollipop into the mouth will make the bone conduction based sound generating lollipop leaking sound seriously, not only affecting the sound quality, but also not conducive to protecting a user privacy.

Based on the above technical problems, this embodiment provides an integrated bone conduction based sound generating lollipop. By using an integrated bone conduction sound generating device, not only an original volume of the lollipop is maintained to a certain extent, but also the sound quality effect is effectively improved, that is, the sound quality is effectively improved while it is easy for the user to put the lollipop into the mouth.

FIG. 1 is a structural diagram of a bone conduction based sound generating lollipop provided by an embodiment of the present disclosure. As shown in FIG. 1, the bone conduction based sound generating lollipop in this embodiment includes a housing 1, a sound generating component 5 arranged in the housing 1, a controller 2, and a trigger 21. The housing 1 includes at least one supporting component 11 suitable for being put into the mouth, and the supporting component 11 is configured to support an edible object 7.

In an implementation, the sound generating component 5 includes at least one electric receiving element 3 and at least one vibrating element 4. The controller 2 is electrically connected with the electric receiving element 3 through a wire, and when a user sends an opening instruction through the trigger 21;

or when the trigger 21 detects that the lollipop has entered the mouth of the user, the controller 2 receives the opening instruction sent by the trigger 21, and transmits an electrical signal containing sound information to at least one electric receiving element 3. The electric receiving element 3 generates a changing magnetic field after being excited by the electrical signal, drives the vibrating element 4 to generate a vibration signal, and the vibration signal is transmitted to the edible object 7 through the housing 1, and the vibration signal is suitable for being transmitted to an auditory system in a bone conduction manner. When the edible object 7 or the supporting component 11 contacts with a human oral cavity or teeth, the vibration signal is transmitted to a muscle tissue, teeth or bones of the human oral cavity through the housing 1 and the edible object 7, and then transmitted to the auditory system of the human, that is, the vibration signal is transmitted to the auditory system in the bone conduction manner, and the vibration signal can also be transmitted to the auditory system in the bone conduction manner directly via the housing 1.

It should be noted that the user described in this embodiment can be a person or other animals with oral cavity, such as dogs or cats. This embodiment does not define the user. In this embodiment and subsequent examples, a detailed description is made by mainly taking an example of applying the bone conduction sound generating lollipop to people.

Figure 2:
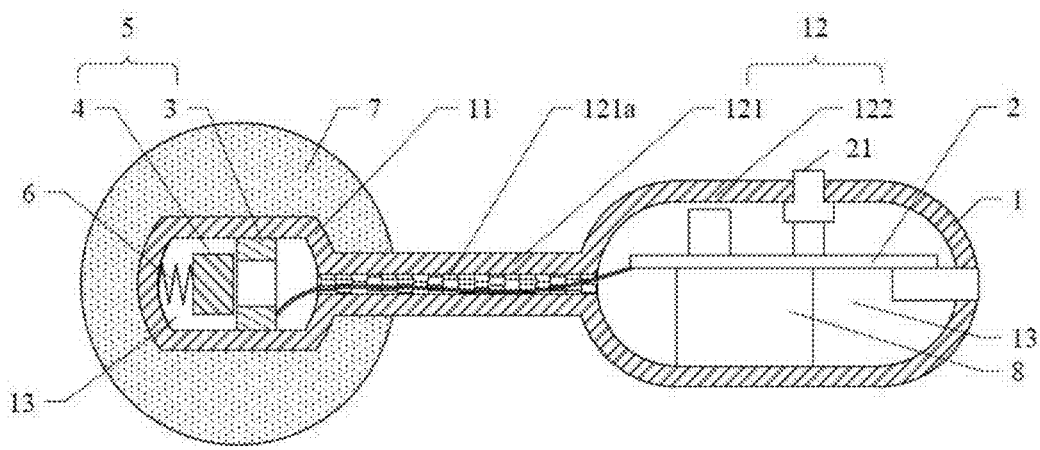
FIG. 2 is a structural diagram of a bone conduction based sound generating lollipop provided by another embodiment of the present disclosure.

FIG. 2 is a structural diagram of a bone conduction based sound generating lollipop provided by another embodiment of the present disclosure. As shown in FIG. 2, in this embodiment, a housing 1 further includes a handle shaped component 12, a supporting component 11 is connected with the handle shaped component 12, and further in an implementation, the handle shaped component includes a connecting section 121, a system section 122, and a sound leak-proof structure or sound leak-proof material 121a attached to an inner wall of the connecting section 121 of the handle shaped component. One end of the connecting section 121 is connected with the supporting component 11, and the other end is connected with the system section 122. A controller 2 is arranged in the system section, and the controller 2 is connected with an electric receiving element 3 of a sound generating component 5 in the supporting component 11 through the connecting section 121 via a wire, thereby realizing that the controller 2 transmits an electrical signal to the electric receiving element 3.

This distributed layout can further reduce a volume of the supporting component 11, or make the supporting component 11 have more space to increase an amount of the electric receiving elements and vibration elements, thereby increasing a frequency domain range of vibration frequency characteristics, and improving a sound quality. The sound leak-proof structure or sound leak-proof material 121a can avoid transmitting a vibration to the handle shaped component and forming a leaky sound when the supporting component vibrates, thus improving the sound quality of the bone conduction lollipop, thereby protecting a user privacy and avoiding interference to a surrounding environment.

It should be noted that a difference between the sound generating component 5 of this embodiment and a sound generating structure in a traditional bone conduction sound generating device is that the traditional sound generating structure has an independent housing that can package the sound generating structure. An existing technical means to improve the sound quality of the bone conduction sound generating device is to increase the amount of sound generating structures in different frequency domains, but the traditional sound generating structures are individually packaged, which increases the volume and weight of the housing geometrically, and a production cost also increases correspondingly. And since the packaging housing will increase a transmission distance of vibration, the vibration signal is attenuated, that is, making a sound quality loss.

In an implementation, the sound generating component 5 described in the above embodiment includes relevant actuating elements capable of generating vibration. The inventor of the present application has found through creative exploration in practice that a packaging manner of the sound generating structure 5 can be an integrated package with the multiple vibration actuating elements, or can be a package relying on the housing 1 of the bone conduction based sound generating lollipop, that is, the sound generating component 5 is embedded into a cavity 13 formed by the housing 1, or the housing 1 packs the sound generating component 5; the package of the sound generating component 5 can also be the package shared with the controller 2, that is, the sound generating component 5 is integrated with the controller 2; and the package of the sound generating component 5 can also be the integrated package that integrated with the controller 2 and the housing 1, as shown in FIG. 1, which is to integrate the above three into the cavity 13 formed by the housing.

The bone conduction based sound generating lollipop provided by this embodiment includes the housing, trigger, controller and sound generating component. The sound generating component, the controller and the trigger are integrated into the packaging cavity formed by the housing, and a separate packaging of the sound generating component is eliminated. When a supporting component of the housing enters the human oral cavity, the trigger sends the opening instruction to the controller, the controller drives the sound generating component to vibrate, and then the vibration signal is transmitted to a human auditory system in a bone conduction manner after passing through the supporting component of the housing and an edible object attached to the supporting component, and passing through an oral tissue or teeth of the human body. Compared with an existing bone conduction sound generating lollipop, the packaging housing of a traditional sound generating structure is eliminated or reduced, making a structure of a bone conduction sound generating component simple and highly integrated, thereby a miniaturization of the bone conduction based sound generating lollipop is achieved, and a sound quality loss of the device is reduced, and thus improving the sound quality.

Figure 3:
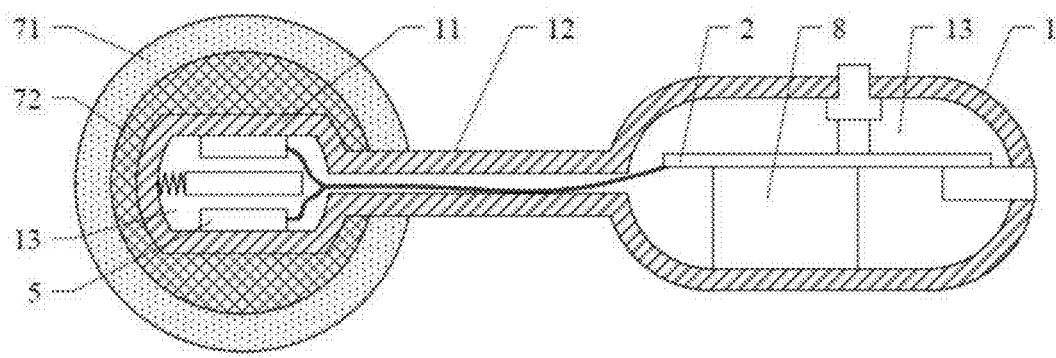
FIG. 3 is a structural diagram of a bone conduction based sound generating lollipop provided by yet another embodiment of the present disclosure.

FIG. 3 is a structural diagram of a bone conduction based sound generating lollipop provided by yet another embodiment of the present disclosure. As shown in FIG. 3, in this embodiment, an edible object 7 includes candy, chocolate, molars, dried meat and other foods, and can also be a drug, and the edible object 7 can also be composed of two or more different edible objects.

In an implementation, the edible object 7 is a rigid material or a colloidal material with high hardness, which is suitable for transmitting a vibration signal. The colloidal materials refer to a semi-solid gel materials that can maintain a certain form, such as agar.

In one possible implementation, the edible object 7 can have a liquid sandwich, specifically, as shown in FIG. 3, the edible object 7 includes an outer layer 71 and an inner layer 72, and the outer layer 71 covers an outer side of the inner layer 72. The inner layer 72 can be a liquid material, such as liquid syrup or other liquid edible materials, and the outer layer 71 can be the rigid material or a hard gum material, which is suitable for conducting the vibration signals when contacting with the teeth and can prevent the liquid inner layer 72 from flowing out. The liquid materials of the inner layer 72 include solution, suspension and emulsion.

In an implementation, the bone conduction based sound generating lollipop can have a predetermined sound generating time, such as 10 minutes, and an amount of the edible object 7 should be enough to maintain the predetermined sound generating time, so that the edible object 7 is not consumed when the sound information is played, and the user can enjoy the delicious food while experiencing a beauty of music when using the bone conduction based sound generating lollipop, which improves a sense of pleasure and use experience of the user.

In addition, in this embodiment, a trigger 21 (not shown in the drawing) can also include a sensor, and the sensor can generate a corresponding trigger signal, that is, an opening instruction, by detecting a use environment of the bone conduction based sound generating lollipop, and the controller 2 can drive a sound generating component to vibrate according to the opening instruction.

In an implementation, the sensors include one or more of the following: pressure sensor, optical sensor, temperature sensor, humidity sensor and capacitance sensor.

In one possible design, when the sensor is the pressure sensor, when the user puts the lollipop into his mouth and occludes the lollipop with his teeth, the edible object 7 will transmit a pressure to the housing 1, which will cause the pressure sensor attached to the housing 1 to detect a pressure change, and generate an electrical signal, that is the opening instruction.

In an implementation, the user can touch the lollipop housing 1 or an edible object 7 within a preset interval to reach a preset time. At this time, the pressure sensor detects above behavior of the user and converts the touch into an electrical signal and transmits it to the controller 2. The controller 2 enters a corresponding operation mode according to a preset mode determination condition, so as to perform operation on the sound source. For example, if the user continuously occludes and knocks the edible object 7 within 2 seconds, and the pressure sensor detects two pressure changes, then the controller 2 will automatically play a next music.

It can be understood that the above operation modes include: a fast forward operation, a fast backward operation, an operation of skipping to next audio program, an operation of skipping to previous audio program, an operation of reducing preset volume and an operation of increasing preset volume. Those skilled in the art can set the operation mode and its corresponding trigger conditions according to specific circumstances. The present disclosure does not repeat similar operations, that is, the present disclosure does not specifically define a scope of the operation mode.

In an implementation, the user can also change the corresponding operation mode by changing the pressure of touching the lollipop. When the pressure change range detected by the controller 2 through the pressure sensor is greater than/less than a preset threshold range, the controller 2 uses the corresponding operation mode to perform operation on the sound source according to the preset pressure threshold. For example, when the user is about to finish eating the edible object 7, the bone conduction vibration will transmit more vibration energy due to a reduction of a transmission distance, which will cause the user to feel that the volume is increased. At this time, the user can occlude the supporting component 11 of the bone conduction lollipop vigorously, the pressure sensor detects that a pressure value is greater than the preset pressure threshold, and transmits this signal to the controller 2, then the controller 2 recognizes a preset intention of the user, and reduces the volume of the sound source, that is, controls the sound generating component 5 to reduce a vibration intensity, thereby reducing the volume.

In another possible design, when the sensor is a light sensor, when the user puts the lollipop into the mouth, the light sensor detects that a surrounding brightness has changed, and generates the electrical signal, that is, the opening instruction. The controller 2 would perform corresponding operations on the sound source according to the opening instruction.

In another possible design, the sensor includes one or a combination of several of the following: a temperature sensor, a humidity sensor and a capacitance sensor. Since a temperature of the oral cavity is higher than an external environment, a humidity of the oral cavity will also be different from the external environment, and a skin fluid in the oral cavity will also cause a change in a capacitance, these characteristics of the oral cavity can be configured to detect whether the bone conduction lollipop is being used by users, so as to realize a function of automatic opening and improve a user experience.

It can be understood that those skilled in the art can also combine the above sensors to use, which can increase a judging complexity, so as to improve an accuracy of judging a user intention when using the bone conduction based sound generating lollipop.

Furthermore, on the basis of the above embodiments, in another embodiment of the present disclosure, the bone conduction based sound generating lollipop can further include a timer. When the user places the lollipop in the mouth or occludes the lollipop, the sensor detects an action of the user. The controller 2 identifies that the user is using the lollipop through the sensor, and then indicates the timer to start timing. Since the edible object 7 will continue to melt with a time in the mouth, the controller 2 can predict a melting degree of the lollipop according to the time recorded by the timer, thereby adjusting a volume of the sound source accordingly. In this way, a function that the lollipop can automatically adjust the volume can be realized, which would improve the user experience and a product quality.

In another embodiment of the present disclosure, the controller 2 can further include a memory, in which sound information can be stored in advance, and the controller 2 converts the pre-stored sound information into a corresponding electrical signal and transmits it to the corresponding sound generating component 5. The memory may be any device suitable for storing information and facilitating in controlling of a device in the system that obtains information, including semiconductor memory, magnetic surface memory and the like.

In an implementation, the controller 2 may further include an identification chip, configured to establish a communication connection with an external device and perform a verification interaction processing with the external device.

In this example, when the user enters a certain place with a purchased lollipop, the communication connection with the external device, that is, an authentication device entered the certain place can be established through the identification chip set in the lollipop, and then an electronic ticket in the identification chip is verified with a radio frequency identification (RFID) technology or other methods, so that the user no longer needs to hold a separate ticket, thereby improving a utilization rate of the lollipop, that is, it can not only be used to taste while listening to the sound data needed by the user, but also be used as a proof of access.

In an implementation, the controller 2 can further include a data input interface, configured to receive the sound information sent by the external device in a wired and/or wireless manner. The controller can convert the sound information sent by the external device into a corresponding electrical signal and transmit it to the corresponding sound generating component 5, to drive the sound generating component 5 to vibrate.

The data input interface includes interfaces suitable for receiving electrical signals, radio waves, magnetic signals, optical signals and the like that containing the sound information, such as USB interface, eSATA interface, SD card interface, Micro SD card interface, audio input interface, video input interface, Wi-Fi interface, Bluetooth interface, metal electrode and microphone; the data input interface can include one of the above interfaces or a combination of multiple interfaces.

That is, the controller 2 can convert the sound information stored in the memory or the sound information obtained from the data input interface into the corresponding electrical signal, to drive the sound generating component 5.

It should be noted that the electric receiving element 3 can drive the vibration element 4 to vibrate in a various ways. During a process of converting the electrical signal sent by the controller 2 into the vibration signal, an energy form exists between the electric receiving element 3 and the vibration element 4 can be diverse, including magnetic energy, thermal energy, mechanical energy and the like. The electric receiving element 3 and the vibration element 4 can be various components that can cooperate with each other to convert the electrical signal containing the sound information into the corresponding vibration signal.

In addition, the sound generating component 5 in the above embodiment of the present disclosure can be implemented in various ways. A structure of the sound generating component 5 will be described in detail below.

Figure 4A:
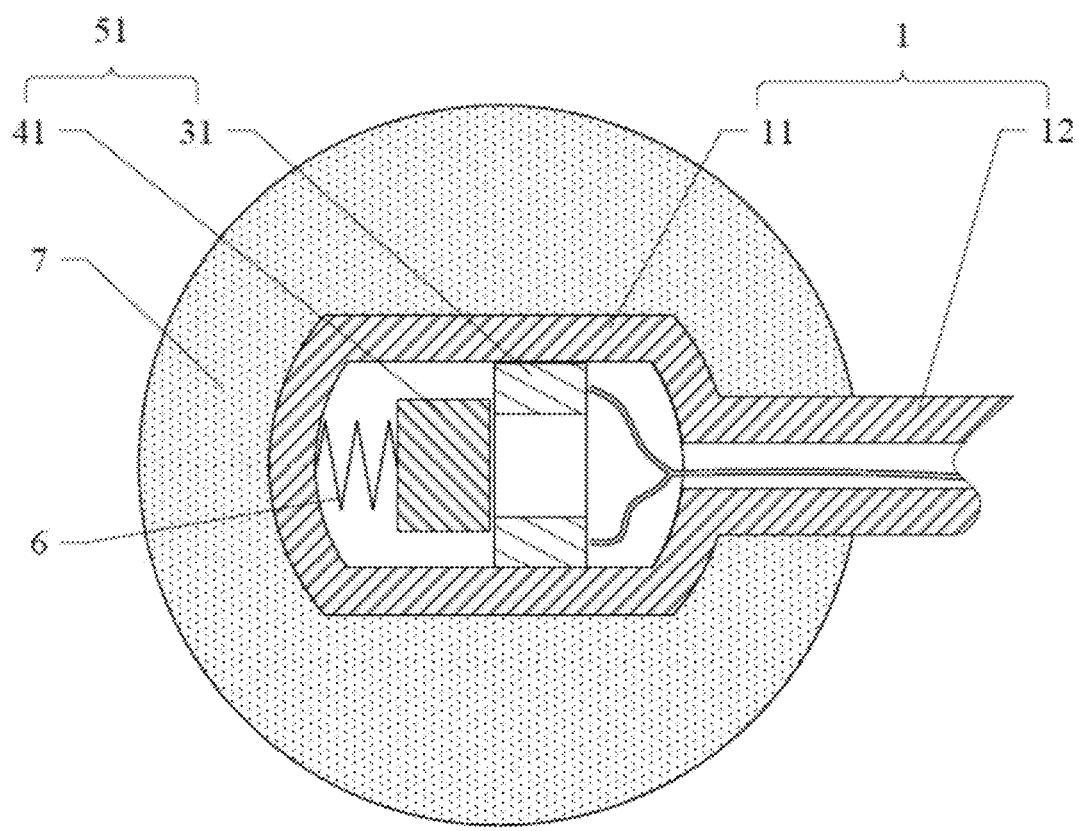
FIG. 4*a*-4*e* are diagrams of various implementations of an energy conversion unit in a sound generating component in various embodiments of the present disclosure.

FIG. 4a-4e are diagrams of various implementations of an energy conversion unit in a sound generating component in various embodiments of the present disclosure. As shown in FIG. 4a, in one optional implementation, the sound generating component 5 includes at least one electric receiving element and at least one vibrating element. The electric receiving element in FIG. 4a is a first coil 31, and the vibrating element is a magnet 41. However, specific forms of the electric receiving element and the vibrating element are not limited to this.

It should be noted that the magnet 41 in this embodiment can also be a magnetic body composed of coils or the magnetic body composed of coils and magnets. Similarly, the first coil 31 can also be a magnetic body composed of coils and/or magnets. In the present application, the magnetic body refers to a component capable of generating a magnetic field or a structural module capable of generating the magnetic field. The magnet and coil mentioned in the following implementations can have similar implementations. It is explained herein and will not be repeated hereinafter. The present disclosure does not define the specific form of the magnetic body, and all components that can generate the magnetic fields belong to a scope of the magnetic body described in the present disclosure.

The first coil 31 and the magnet 41 form a set of energy conversion units 51, which generate a vibration signal according to an electrical signal sent by a controller 2 (not shown in the drawing). When both of the electric receiving element and the vibrating element are determined components, a frequency response characteristics of the energy conversion unit 51 are determined accordingly, and the sound generating component has a fixed frequency response curve. In this embodiment, a function of the energy conversion unit 51 is to convert an electric energy into a magnetic field through the first coil 31. The energized first coil 31 generates the magnetic field, which makes a magnetic action with the magnet 41 to make the magnet 41 exert pressure on a supporting component 11 through a mechanical connection, causing the supporting component 11 to deform, and a deformation quantity would be changed with an adjustment of a strength of the magnetic field by the electrical signal, making the supporting component 11 and the magnet 41 vibrate together, thereby realizing that the electrical signal sent by the controller 2 is converted into the vibration signal carrying the sound information, that is, a vibration sound generating is realized.

In an implementation, the energy conversion unit 51 may further include at least one elastic structure or elastic element 6 connected with the supporting component 11, which transmits the vibration signal generated by the vibration element to the supporting component 11. The elastic element or elastic structure 6 includes springs, rubber blocks and the like. The frequency response characteristics of the corresponding energy conversion unit 51 can be adjusted by adjusting parameters such as specific form, structure, material and the like of the elastic element or elastic structure 6.

FIGS. 4b to 4e are structural diagrams of second to fifth energy conversion units in this embodiment. As shown in FIGS. 4b to 4e, in another optional implementation, the sound generating component 5 includes at least two electric receiving elements and/or at least two vibration elements. Therefore, the electric receiving elements and the vibration elements form at least two groups of energy conversion units, and each energy conversion unit is configured to generate corresponding vibration signals in response to the electrical signals sent by the controller 2 (not shown in the drawings). When the energy conversion unit includes at least two electric receiving elements and the electric receiving elements are the first coils, multiple first coils can be arranged coaxially, side by side or set in other ways. In each energy conversion unit, if there are vibration groups formed by multiple groups of magnets and coils, each vibration group can have different frequency response characteristics. Further in an implementation, each group of the energy conversion units can have the same frequency response characteristics or have different frequency response characteristics. When multiple energy conversion units have more than two kinds of frequency response characteristics, a controller can drive different energy conversion units to work with different frequency response curves. Therefore, one or more groups of energy conversion units with specific frequency response characteristics can be selected to vibrate according to specific circumstances, which can significantly improve a sound quality.

Figure 4B:
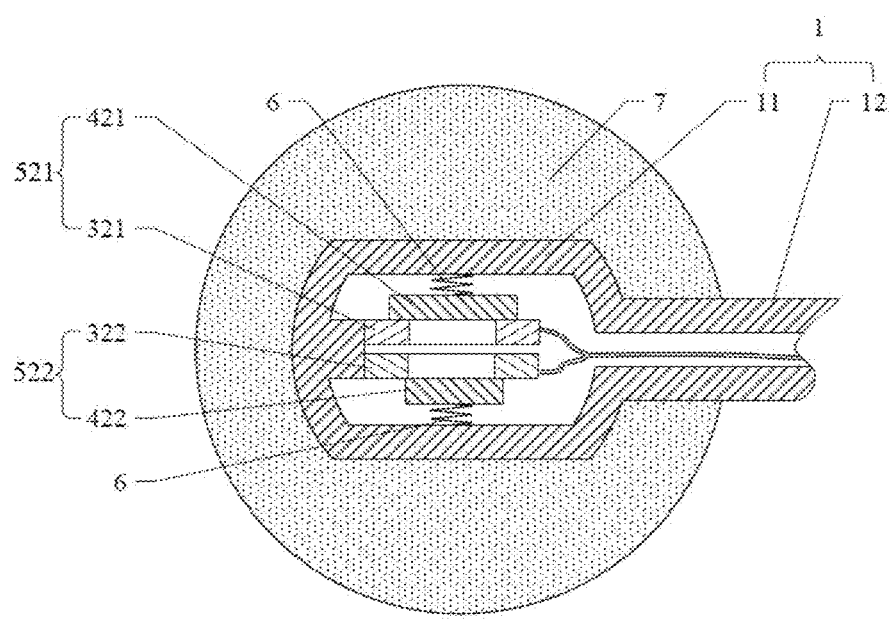

As shown in FIG. 4b, in an optional implementation, an amount of the electric receiving elements and vibration elements is the same, the electric receiving elements and the vibration elements correspond one by one, and each electric receiving element is electrically connected with the controller 2 and drives the corresponding vibration element to vibrate, thus forming multiple groups of energy conversion units. The bone conduction based sound generating lollipop as shown in FIG. 4b includes two electric receiving elements and two vibration elements, forming two groups of energy conversion units, namely the energy conversion unit 521 and the energy conversion unit 522. The frequency response characteristics of the multiple groups of energy conversion units can be different. The controller 2 can drive one or more groups of energy conversion units with corresponding frequency response characteristics to vibrate according to a frequency band characteristics of the sound information. Specifically, the controller 2 sends corresponding electrical signals to one and more groups of energy conversion units with a highest matching degree between a frequency of a resonant peak and the frequency band characteristics of the sound information. In FIG. 4b, the electric receiving elements are the first coil 321 and the first coil 322, and the vibration elements are the magnet 421 and the magnet 422, but the specific forms of the electric receiving element and the vibration element are not limited to this.

Figure 4C:
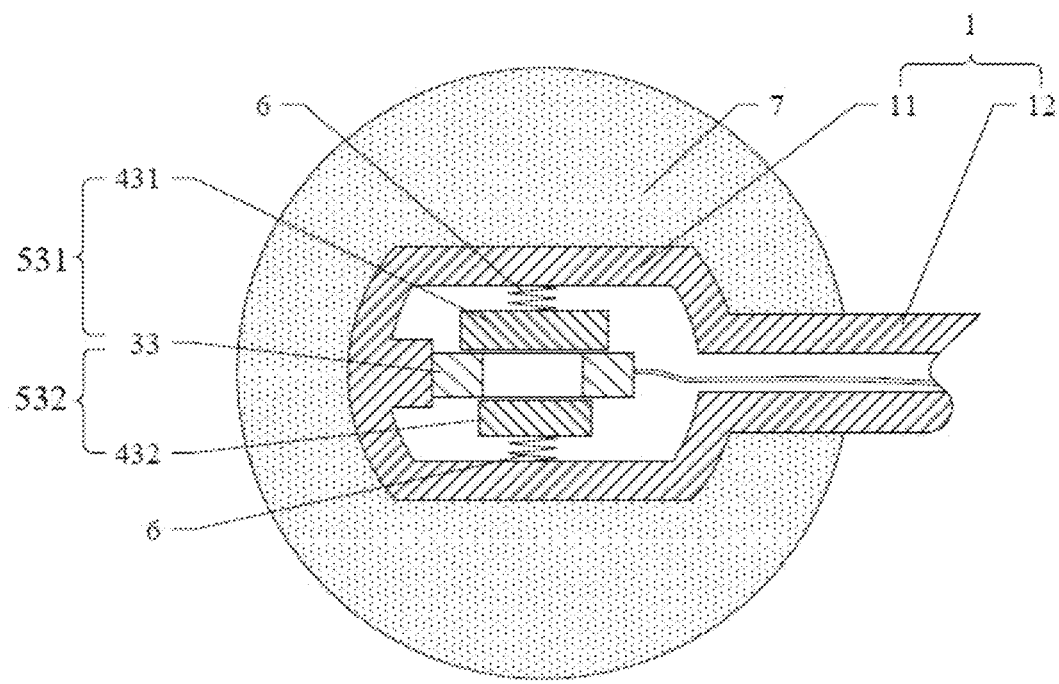

In another optional implementation, as shown in FIG. 4c, the sound generating component includes at least two vibration elements and forms at least two groups of energy conversion units, and the at least two groups of energy conversion units share a common electric receiving element, that is, at least one electric receiving element can drive more than two different vibration elements. In FIG. 4c, the electric receiving element is the first coil, and the vibrating element is the magnet. Obviously, the electric receiving element and vibration element can also be other elements. As shown in FIG. 4c, the sound generating component includes one first coil 331 and two magnets 431 and 432, the two magnets 431 and 432 are respectively arranged in both sides of the first coil 331, and both of the magnets 431 and 432 are within an effective action range of a magnetic field generated by the first coil 331, that is, the first coil 331 can drive both of the magnet 431 and the magnet 432, thus forming two groups of energy conversion units, namely, the energy conversion unit 531 and energy conversion unit 532. Obviously, the two magnets 431 and 432 can also be arranged in the same side of the first coil 331. Parameters of the two magnets 431 and 432 such as weights, sizes, materials and magnetic air gaps with the first coil 331 can be different. Therefore, the two groups of energy conversion units 531 and 532 have different frequency response characteristics. When the controller 2 sends the electrical signal to the first coil 331, the two magnets 431 and 432 are driven to vibrate. Therefore, the vibration signal output by the bone conduction based sound generating lollipop is a superposition of the two groups of energy conversion units 531 and 532, thereby improving the sound quality of the bone conduction based sound generating lollipop, and reducing an overall volume of the sound generating component. The two groups of energy conversion units 531 and 532 in FIG. 4c can form a pair of energy conversion units. Those skilled in the art can set one or more pairs of energy conversion units as shown in FIG. 4c in the sound generating component according to actual requirements.

Figure 4D:
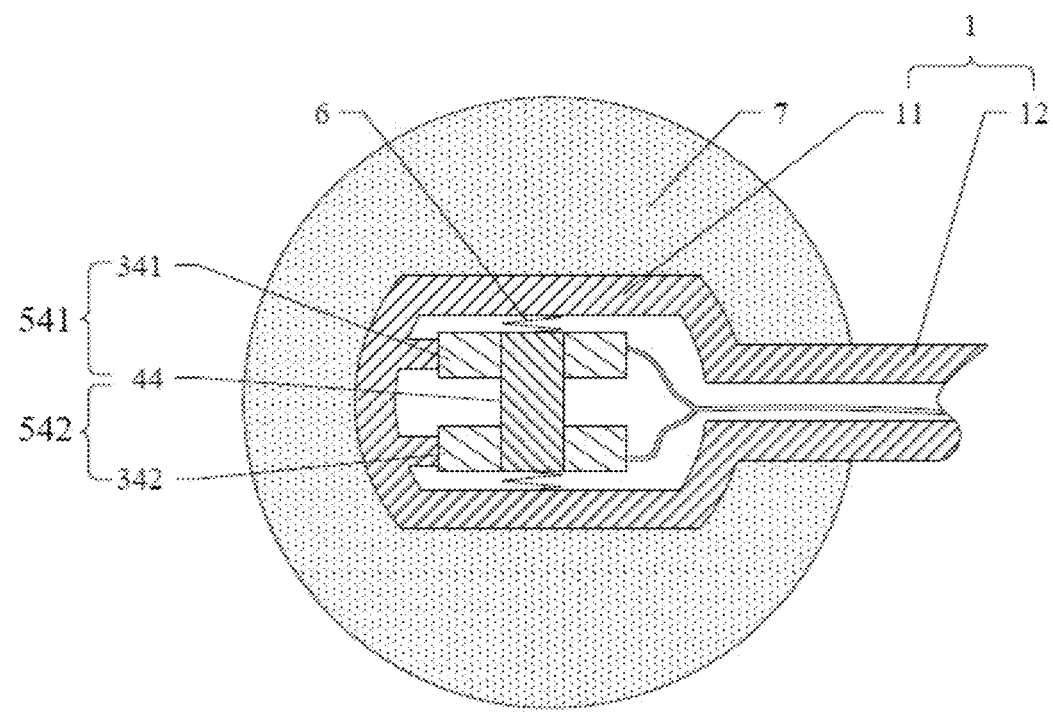
Figure 4E:
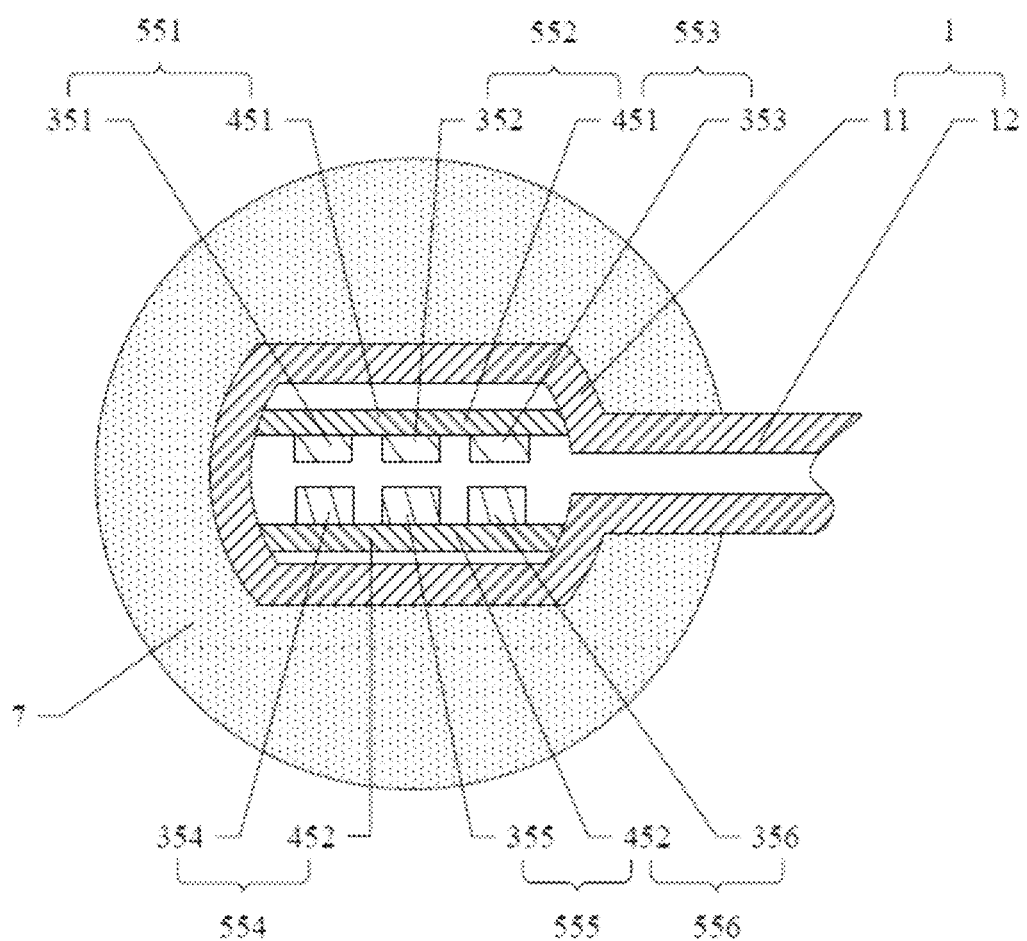

In another optional implementation, as shown in FIGS. 4d and 4e, the sound generating component includes at least two electric receiving elements and forms at least two groups of energy conversion units, and the at least two groups of energy conversion units share a common vibration element, that is, at least one vibration element can be driven by at least two electric receiving elements respectively to vibrate, thereby reducing the overall volume of the sound generating component. In FIG. 4d, the electric receiving element is the first coil, and the vibrating element is the magnet. In FIG. 4e, the electric receiving element is a piezoelectric sheet, and the vibrating element is a vibration diaphragm. It should be understood that, the electric receiving element and the vibrating element can also be other elements.

Further in an implementation, as shown in FIG. 4d, the sound generating component includes two first coils 341, 342 and one magnet 44, and the magnet 44 is within the effective action range of the magnetic field generated by the two first coils 341 and 342, that is, the magnet 44 can be driven by both of the first coil 341 and the first coil 342, thus forming two groups of energy conversion units, namely, the energy conversion unit 541 and the energy conversion unit 542. It can be understood that those skilled in the art can set more electric receiving elements to share one common vibration element to form multiple groups of energy conversion units. The two first coils 341 and 342 can be arranged at the same side of the magnet 44 or can be arranged at both ends of the magnet 44. In an implementation, the magnet 44 and the two first coils 341 and 342 are arranged in the same axis to facilitate a balanced driving for the magnet 44. Turns amounts, materials and magnetic air gaps with the magnet 44 of the two first coils 341 and 342 can be different. Therefore, the two groups of energy conversion units 541 and 542 have different frequency response characteristics. The controller 2 can send the electrical signal to one of the first coils to drive the magnet to vibrate according to the frequency band characteristics of the sound information. Specifically, the controller 2 sends the corresponding electrical signal to a group of energy conversion units with a highest matching degree between the frequency of the resonant peak and the frequency band characteristics of the sound information. The controller 2 can also send the electrical signal to both of the two first coils 341 and 342, so that the magnet 44 is driven by a superimposed alternating magnetic field generated by the two first coils 341 and 342, which can increase an amplitude of the magnet 44, so as to increase the volume. The two groups of energy conversion units 541 and 542 in FIG. 4d can be formed into a pair of energy conversion units. Those skilled in the art can set one or more pairs of energy conversion units as shown in FIG. 4d in the sound generating component according to actual requirements.

Further in an implementation, as shown in FIG. 4e, the sound generating component includes two vibration membranes 451, 452 and six piezoelectric sheets 351, 352, 353, 354, 355 and 356, where three of the piezoelectric sheets 351-353 are mechanically connected with different positions on the vibration membrane 451, and the other three piezoelectric sheets 354-356 are mechanically connected with different positions on the other vibration membrane 452, that is, three piezoelectric sheets share one common vibration membrane. Thus, the sound generating component forms six groups of energy conversion units, namely, the energy conversion units 551-556. The vibration diaphragm is connected with a housing 1. The piezoelectric generates a mechanical deformation by an excitation of the electric signal to drive the vibration diaphragm to generate the vibration signal, and the vibration diaphragm transmits the vibration signal to the housing 1. The frequency response characteristics of each group of energy conversion units can be adjusted by changing a model of the piezoelectric sheet, a connection position between the piezoelectric sheet and the vibration diaphragm, a size and material of the vibration diaphragm and the like. The frequency response characteristics of the six groups of energy conversion units 551-556 in FIG. 4e can be completely different, which can further expand the frequency response range of the sound generating components.

It can be understood that the amount of the piezoelectric sheets mentioned above is not limited to three, that is, the piezoelectric sheets can be set to at least one, and the present application would not limit the position of the piezoelectric sheets. Those skilled in the art can set the amount of piezoelectric sheets and the position of each piezoelectric sheet on the vibration diaphragm according to the specific circumstance.

In addition, the bone conduction based sound generating lollipop according to any one of the above embodiments can further include a switching element, the user may input a switching signal through the switching element, and transmit the signal to the controller. Implementations of the switching element can be a button switch, a toggle switch, or a sensor, such as a light sensor, a temperature sensor, a humidity sensor, a voice control sensor, a capacitive sensors or a combination of at least two of them. Specifically, when the user puts an edible part of a functional structure into the mouth, the light sensor detects that there is no light around, then it is considered that the opening instruction is triggered. Obviously, in order to prevent misjudgment when holding the device in hand, temperature and humidity sensors can also be added. Since a temperature of the oral cavity is higher than a temperature of a body surface, and the oral cavity is wet, a switching requirement of user can be accurately determine through a combination of the above three, so as to realize an automatic switch. The controller sends the electrical signal to the corresponding one or more groups of energy conversion units in response to an opening signal sent by the switch element.

In an implementation, the bone conduction based sound generating lollipop in this embodiment can further include a power unit, such as the power 8 in FIGS. 2 and 3, which is configured to supply power to the controller and a sound generating structure. The power unit can be a replaceable dry battery or button battery, a rechargeable battery, a super capacitor, or an apparatus that can convert a mechanical energy into an electrical energy through movements such as shaking and the like. For example, it can be a structure in a mechanical watch that converts the mechanical energy into the electrical energy by shaking an arm and acting of gravity, or it can be the apparatus that can convert an occluded mechanical energy into the electrical energy through occlusion to generate a pressure difference at different parts of a semiconductor material, or it can be a solar cell.

In an implementation, the bone conduction based sound generating lollipop in this embodiment can further include at least one indicator light, configured to indicate a working state of a bone conduction sound generating device. For example, when the controller drives the sound generating structure to generate the vibration signal, the indicator light is on, which can indicate that the sound generating device is working normally. The working state of the bone conduction sound generating device can include a working state of the sound generating structure, a working state of a functional structure and a power state of a power supply. The indicator light can be set at a non-edible part of the bone conduction sound generating device, which is convenient for observing a working condition of the bone conduction sound generating device, and can also provide a role of decoration, and could improve the user experience.

In an implementation, the bone conduction based sound generating lollipop in this embodiment can further include at least one light-emitting apparatus. For this light-emitting apparatus, when the sound generating structure vibrates and transmits music signals, the controller changes, according to a frequency change of the sound source, a color of light emitted by the light-emitting apparatus or a brightness of lighting, or a combination of the two, that is, changing the color of light while changing the brightness. The light-emitting apparatus can also directly change the color or lighting brightness of the light, or a combination of the two, according to a vibration intensity of the sound generating structure. In this way, a cool shape effect of the bone conduction sound generating device can be increased and the user experience is improved. Specifically, the light-emitting apparatus can also flash according to a predetermined program. The light-emitting apparatus can be arranged at the edible part of the bone conduction sound generating device, or at the non-edible part of the bone conduction sound generating device. The light-emitting apparatus can be a lighting equipment or a lighting material suitable for being arranged on the bone conduction sound generating device. An arrangement of the light-emitting apparatus can enhance an interest of the bone conduction sound generating device.

It should also be noted that the housing 1 can be made of materials suitable for conducting vibration, or at least a head 11 and parts of the housing 1 between the energy conversion unit and the head 11 should be made of materials suitable for conducting the vibration signals, so as to reduce an attenuation of the vibration signals generated by the energy conversion unit in a transmission process.

The head 11 forms a shape suitable for putting into the mouth, such as a sphere shape, an ellipsoid shape, a sheet shape and the like. The head 11 and other parts of the housing 1 that may be put into the mouth shall be made of non-toxic materials to avoid harming a health of the user. Preferably, the whole housing 1 is made of non-toxic materials. The housing 1 may include one head 11 or multiple heads 11, and the multiple heads 11 may contact different positions in the mouth to transmit the vibration signals.

As shown in FIGS. 2 and 3, the housing 1 can further include a handle shaped component 12 connected to the head 11, and the energy conversion unit can be arranged in the head 11 to reduce the attenuation of the vibration signal in the transmission process. The controller 2 can be arranged in the handle shaped component 12, which can reduce the volume of the head 11 to facilitate putting the head 11 into the mouth, and also can improve a safety in use. The handle shaped component 12 can be formed into a shape suitable for the user to grasp, so as to enhance a comfort of the user during use.

In addition, one or more hollow cavities 13 can be formed inside the housing 1, and the energy conversion unit and the controller 2 can be arranged in the hollow cavity 13. When the bone conduction based sound generating lollipop includes multiple groups of energy conversion units, the housing 1 can form multiple cavities 13, and different energy conversion units can be set in different cavities 13. As shown in FIGS. 2 and 3, the energy conversion unit and the controller 2 can also be respectively arranged in different cavities 13. The controller 2 can also be packaged in the housing 1 as a whole. For example, the housing 1 is formed outside the controller 2 by injection molding, so that the controller 2 is packed in the material of the housing 1 without forming the hollow cavity.

The bone conduction based sound generating lollipop provided by this embodiment includes the housing, the trigger, the controller and the sound generating component. The sound generating component, the controller and the trigger are integrated in the packaging cavity formed by the housing, and a separate packaging of the sound generating component is eliminated. When the supporting component of the housing enters the human oral cavity, the trigger sends the opening instruction to the controller, the controller drives the sound generating component to vibrate, and then the vibration signal is transmitted to the human auditory system in a bone conduction manner after passing through the supporting component of the housing and the edible objects attached to the supporting component, and passing through the oral tissue or teeth of the human body. Compared with the existing bone conduction based sound generating lollipop, the packaging housing of the traditional sound generating structure is eliminated or reduced, making a structure of the bone conduction sound generating component simple and highly integrated, thereby a miniaturization of the bone conduction based sound generating lollipop is achieved, and a sound quality loss of the device is reduced, and thus improving the sound quality.

Figure 5:
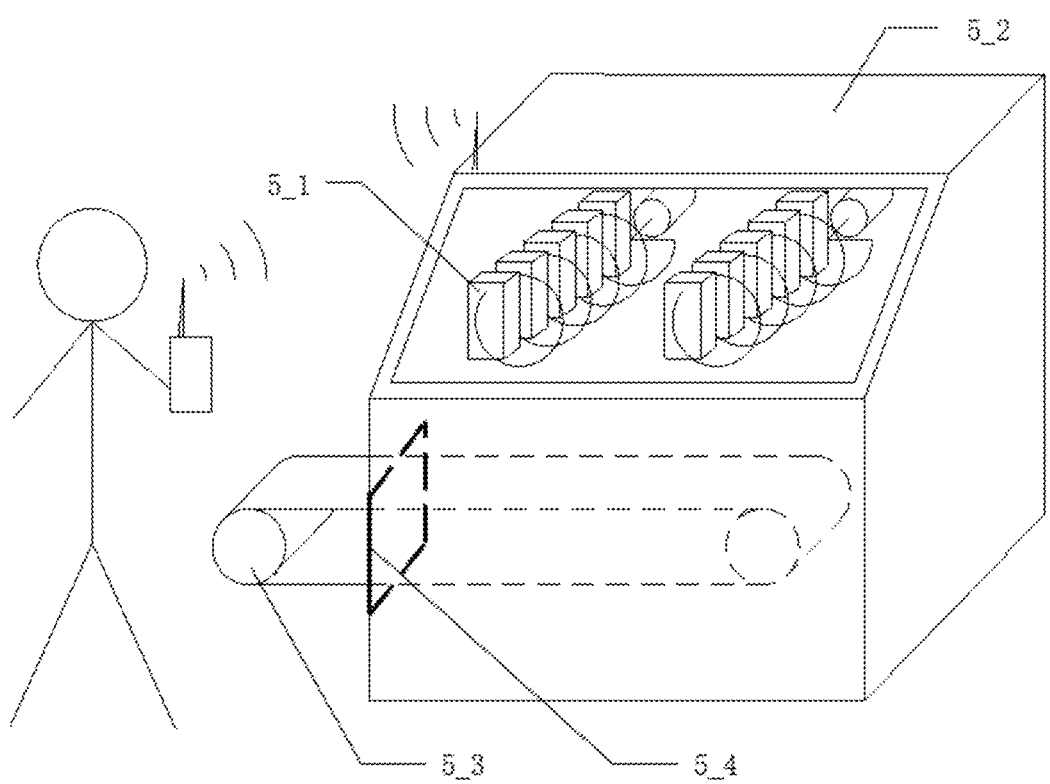
FIG. 5 is a structural diagram of a bone conduction based sound generating lollipop system provided by an embodiment of the present disclosure.

FIG. 5 is a structural diagram of a bone conduction based sound generating lollipop system provided by an embodiment of the present disclosure. As shown in FIG. 5, the bone conduction based sound generating lollipop system provided in this embodiment includes a bone conduction based sound generating lollipop 5_1 and an accommodating box 5_2. The accommodating box 5_2 contains and displays multiple sound generating lollipops 5_1, and a transmission apparatus 5_3 is also set inside the accommodating box 5_2. The transmission apparatus 5_3 is configured to transmit the bone conduction based sound generating lollipop 5_1 to an outlet 5_4 of the accommodating box 5_2 from the accommodating box 5_2 after the user purchasing it. The accommodating box 5_2 is further provided with a control apparatus, the control apparatus would send a transmission instruction to the transmission apparatus 5_3 after receiving a purchase instruction of the user, to transmit the corresponding bone conduction based sound generating lollipop from the accommodating box.

In an implementation, touch buttons or touch screens such as liquid crystal display (LCD) or light-emitting diode (LED) screens are provided on the accommodating box. The user presses the button or touches on the screen to select type and amount of the bone conduction based sound generating lollipop to be purchased. The controller sends a control signal to the transmission apparatus according to the above instructions.

In an implementation, in another implementation, the user can scan code through an intelligent terminal such as a mobile phone, enter a corresponding purchase page, select the bone conduction lollipop to be purchased, and make an online payment, and then the controller sends the control signal to the transmission apparatus according to the received purchase instruction.

In an implementation, the user can also make the above purchase operation through a specified APP.

In one possible implementation, the user can also select or customize to burn the personalized sound source data in the bone conduction based sound generating lollipop in the purchase page, and the personalized sound source includes songs in a song library provided by a service provider, the sound data burned by the user himself and the like.

For the sound data burned by the user himself, an acquisition form of which can be burning by the user himself using the intelligent terminal, such as burning by a recording function of the mobile phone, or it can be a recording apparatus set in the accommodating box, such as a microphone. The user clicks the button or the screen to issue a burning instruction, and then the control apparatus receives a personalized recording recorded by the microphone, and stores recording data in the memory of the bone conduction based sound generating lollipop through wired/wireless mode.

In this embodiment, a type and model of the purchased lollipop, or the sound source data stored in the bone conduction based sound generating lollipop, can also be randomly allocated by a system, which can make the purchase process more interesting and improve the user experience, can also form a mode combining purchase and entertainment, increase a purchase fun, promote the user to purchase, and thus improve a sales volume of the bone conduction based sound generating lollipop.

For the bone conduction based sound generating lollipop system provided by this embodiment, by incorporating the bone conduction based sound generating lollipop into the bone conduction based sound generating lollipop system that can be human-computer interactive, enables the bone conduction based sound generating lollipop to personalize the sound source in a sales link, increase the interest of the sales link, improve the user experience, and promote the sales volume of the bone conduction based sound generating lollipop.

In addition to burning the sound data, other information can also be burned, such as burning electronic tickets. When the user enters a certain place with the purchased lollipop, a communication connection with an external device, that is, an authentication device entered the certain place can be established through an identification chip set in the lollipop, and then an electronic ticket in the identification chip is verified with RFID or other methods, so that the user no longer needs to hold a separate ticket, thereby improving a utilization rate of the lollipop, that is, it can not only be configured to taste while listening to the sound data needed by the user, but also be used as a proof of access.

Figure 6:
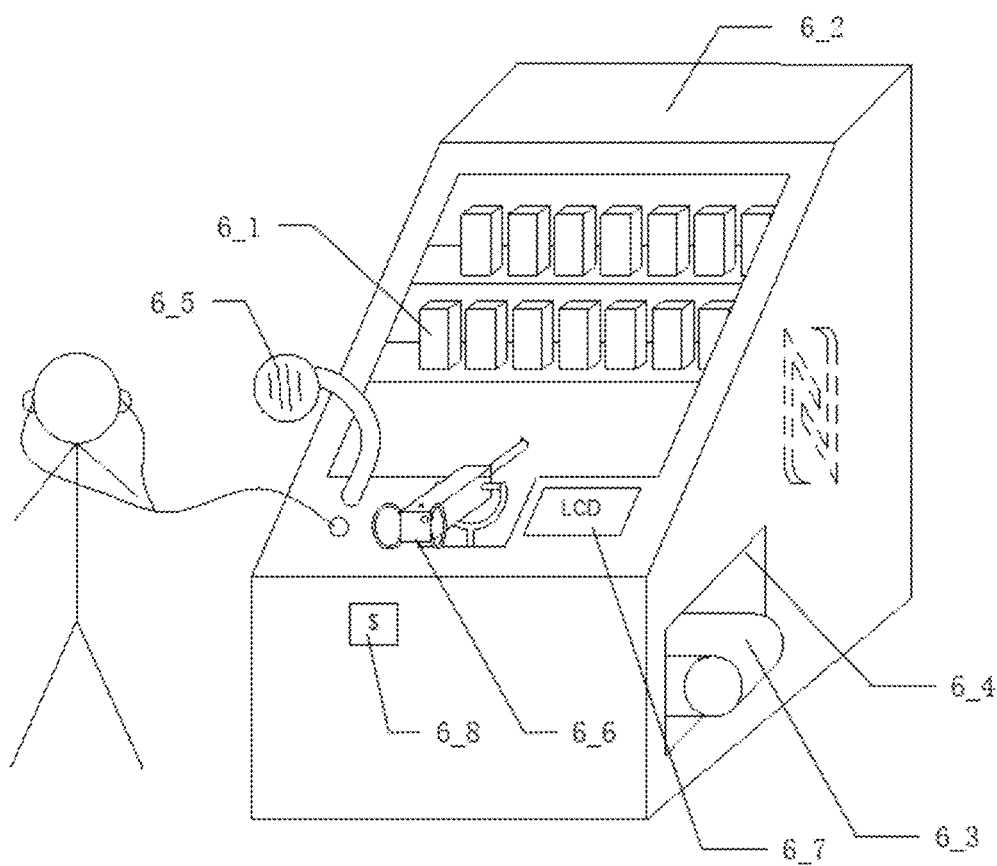
FIG. 6 is a structural diagram of a bone conduction based sound generating lollipop system provided by another embodiment of the present disclosure.

FIG. 6 is a structural diagram of a bone conduction based sound generating lollipop system provided by another embodiment of the present disclosure. As shown in FIG. 6, the bone conduction based sound generating lollipop system provided in this embodiment includes a bone conduction based sound generating lollipop 6_1 and an accommodating box 6_2, the accommodating box 6_2 is provided a glass observation window on an upper side, and a lower part of the observation window is arranged with a lever, that is, a shooting apparatus 6_6. Multiple sound generating lollipops 6_1 are displayed in the accommodating box 6_2 in multiple rows, and a transmission apparatus 6_3 is also set inside the accommodating box 6_2. The transmission apparatus 6_3 is configured to transmit the bone conduction based sound generating lollipop 6_1 to an outlet 6_4 of the accommodating box when the bone conduction based sound generating lollipop 6_1 falls into the transmission apparatus 6_3 from a display stand after the user using the lever, i.e. the shooting apparatus 6_6 to knock down the bone conduction based sound generating lollipop 6_1. A control apparatus is further arranged in the accommodating box 6_2, and the control apparatus sends a transmission instruction to the transmission apparatus 6_3 to transmit the corresponding bone conduction based sound generating lollipop 6_1 from an accommodating box body after it is detected that the bone conduction based sound generating lollipop 6_1 is fell into the transmission apparatus 6_3 from the display stand. In addition, a touch screen LCD screen 6_7, a headphone jack, a microphone 6_5 and a coin change slot 6_8 are installed below the glass observation window.

In an implementation, the accommodating box is provided with the touch buttons or the touch screens, such as the LCD crystal screen 6_7. The user presses the button or touches the shooting apparatus 6_6 on the screen to shoot the bone conduction based sound generating lollipop 6_1 that wanted by the user.

In an implementation, after the user shooting down the bone conduction based sound generating lollipop 6_1, the LCD screen 6_7 may display a user personalized setting prompt, and the user can use the microphone 6_5 to record a personalized sound according to the setting prompt, or selects a music in a music library directly through the LCD liquid crystal screen 6_7, and transmit it to the memory of the bone conduction based sound generating lollipop 6_1 through a wired/wireless apparatus of the bone conduction based sound generating lollipop system.

It should be understood that, when in use, the user uses the touch screen, chooses to purchase a product, and uses the microphone to burn the customized audio. Then a headset can be plugged into a headphone jack to listen to the burned audio. When a satisfaction is reached, a payment is completed through a coin change port.

In an implementation, after the bone conduction based sound generating lollipop 6_1 is hit, it will be leaks to the transmission apparatus through a funnel apparatus. An optical sensor senses that a product passes through, starts a delivery system, and the product is transmitted to a burning apparatus by the transmission apparatus. The data is transmitted to the product, that is, the audio burned by the user is burned into the product, through a near field communication (NFC) mode. After the burning is completed, the product is transported to a product shipping apparatus, and directly drops onto a shipping structure by dropping, so that the user can take the product directly.

In this embodiment, a playback set of the bone conduction based sound generating lollipop 6_1 is to play a recording first, and then play a music file, which completes a personalized customization requirement of putting the customized recording into the bone conduction based sound generating lollipop.

FIG. 7 is a structural diagram of a bone conduction based sound generating lollipop system provided by yet another embodiment of the present disclosure. As shown in FIG. 7, this embodiment is a bone conduction based sound generating lollipop device, which can use mobile phones or touch screens to select products and conduct personalized customization. The device includes: a bone conduction based sound generating lollipop 7_1, an accommodating box 7_2, an observation window, a controller arranged inside the accommodating box 7_2, which includes a user interaction system and a product delivery system. A core circuit of the controller includes NBIoT network interface, network cable interface, and the user interaction system includes mobile phone operating software, a touch screen operating system 7_7, a microphone 7_5, a directional loudspeaker, a code scanner 7_6. The product delivery system includes a storage apparatus, a sorting apparatus, a transporting apparatus, burning apparatus, packaging apparatus, shipping apparatus and the like of the bone conduction based sound generating lollipop 7_1.

A left side glass observation window is located at a lower part of an observation range of the observation window, the products that need to be charged are classified and disassembled on charging piles using a TYPE-C interface. A 3-axis manipulator 7_3 is set inside the accommodating box 7_2, within a scope of the observation window and above the charging pile for sorting products, the product packaging apparatus, product shipping apparatus and core circuit are set inside the accommodating box 7_2 and outside the scope of the observation window. The product burning apparatus is completed using the TYPE-C interface of the product storage apparatus. The touch screen, microphone, directional loudspeaker and code scanner are installed on the outside of the housing and on the right side of the observation window.

When the user selects the bone conduction based sound generating lollipop 7_1 with a specific shape and finishes burning. The manipulator 7_3 is operated to take out the product directly according to a position of the bone conduction based sound generating lollipop 7_1 in the storage apparatus, put it on the product packaging apparatus, and pack the product in a mechanical folding manner. Then the packaged bone conduction based sound generating lollipop 7_1 is transmitted to the outside of the accommodating box 7_2 via a transmitting port 7_4 by the manipulator of the product shipping apparatus, to be presented to the user.

When in use, the user firstly selects shape and background music of the bone conduction based sound generating lollipop 7_1 from the touch screen 7_7, then uses the microphone 7_5 on the device to burn the customized audio, and complete a mixing operation through operations on the touch screen. Through the directional speaker, the user can listen to the recording, music, and mixed audio. When a satisfaction is reached, the use scans to pay through a two-dimensional code 7_6 using the mobile phone, and informs the device that the payment has been made through the touch screen 7_7. The device is connected to the Internet through the network cable interface to confirm payment information.

In an implementation, the user can also complete the above operations through an intelligent terminal, such as the mobile phone. The difference is that before use, the user needs to use the intelligent terminal for networking, and a networking mode can be wi-fi, Bluetooth, 5G communication and the like. Further in an implementation, the user can operate through special software in the intelligent terminal. Then the user uses the microphone of the intelligent terminal to burn the customized audio, and completes the mixing operation through the operation on the intelligent terminal. Through a player of the intelligent terminal, the user can listen to the recording, music, and mixed audio. When a satisfaction is reached, the user uses the intelligent terminal to make online payment, and informs the device that the payment has been made. The device is connected to the Internet through the network interface to confirm the payment information.

After confirmation, the burning apparatus uses the TYPE-C interface to burn a generated mixing file into the bone conduction based sound generating lollipop 7_1, then the burning is completed. The manipulator is operated to take out the product directly according to the position of the bone conduction based sound generating lollipop 7_1 in the storage apparatus, place it on the product packaging apparatus, and pack the product in a manner of mechanically folding a carton. Then the packaged bone conduction based sound generating lollipop 7_1 is transmitted to the outside of the accommodating box 7_2 via a transmitting port 7_4 by the manipulator of the product shipping apparatus, to be presented to the user, and the user can take the product directly.

The bone conduction based sound generating lollipop system in the above two embodiments makes full use of the memory of the bone conduction based sound generating lollipop to store the sound source and a function of completing the data transmission through an external interface by providing a human-computer interactive automatic selling device with personalized burning function, so that users can purchase the bone conduction based sound generating lollipop in various interactive and interesting ways, which enriches an experience when selling, and improves a sales volume of the bone conduction based sound generating lollipop.

FIG. 8 is a flow diagram of a bone conduction based sound generating lollipop processing method provided by an embodiment of the present disclosure, as shown in FIG. 8, the method includes:

S101, receiving, by a controller, an opening instruction through a trigger, or determines whether the lollipop enters an oral cavity of an object to be sounded or touches teeth through the trigger.

S102, driving, by the controller, a sound generating component to generate a vibration signal when the controller determines that the opening instruction is received, or determines that the lollipop enters the oral cavity of the object to be transmitted or touches the teeth through the trigger, to transmit the vibration signal to an auditory system of the object to be sounded through at least one supporting component and the lollipop.

In this embodiment, this method can be applied to the bone conduction based sound generating lollipop as shown in above FIG. 1. An implementation principle and technical effect are similar, which will not be elaborate herein.

In an implementation, in order to enable a user to listen to some music or stories according to their requirements while tasting the lollipop, and considering that the lollipop should be ensured a continuity of playing music or stories according to frequently in and out of the oral cavity by the user, the present disclosure also provides the following preferred implementation:

in one possible design, when a sensor includes a pressure sensor, the controller triggers the sound generating component to generate the vibration signal according to a pressure change generated by touching the lollipop sensed by the pressure sensor.

In another possible design, when the sensor includes a light sensor, the controller triggers the sound generating component to generate the vibration signal according to a light change around the lollipop sensed by the light sensor.

In another possible design, when the sensor includes a temperature sensor and/or a humidity sensor, the controller triggers the sound generating component to generate the vibration signal according to a temperature and/or humidity change around the lollipop sensed by the temperature sensor and/or humidity sensor.

In yet another possible design, the controller operates a sound source using an operation mode corresponding to a preset times, when the times of touching the lollipop by the teeth in the human oral cavity touch within a preset interval range reaches the preset time sensed by the pressure sensor.

The operation modes include one or more of the following:

a fast forward operation, a fast backward operation, an operation of skipping to next audio program, an operation of skipping to previous audio program, an operation of reducing preset volume and an operation of increasing preset volume.

In another possible design, the controller reduces a volume of a sound source when the pressure sensor recognizes that a pressure change range of touching the lollipop is greater than a preset threshold range.

In another possible design, the controller records a time of the lollipop in the oral cavity using the timer when the lollipop is determined to enter a human oral cavity; and the controller determines a melting degree of the lollipop according to the time of the lollipop in the oral cavity recorded by the timer, and adjusts a volume of a sound source according to the melting degree.

In order to ensure an accuracy of control, the above possible designs can be used together without limitation here.

After considering the specification and practicing the present disclosure disclosed herein, those skilled in the art will easily think of other embodiments of the present disclosure. The present disclosure aims to cover any variants, usages or adaptive changes of the disclosure, which follows general principles of the present disclosure and includes the common general knowledge or frequently used technical means in the technical field not disclosed in the present disclosure. The description and embodiments are only regarded as exemplary, and a true scope and spirit of the present disclosure are pointed out in the following claims.

It should be understood that the present disclosure is not limited to a precise structure already described above and shown in the drawings, and various modifications and changes can be made without departing from its scope. The scope of the present disclosure is limited only by the appended claims.

What is claimed is:

1. A bone conduction based sound generating lollipop, comprising: a housing, a trigger, a controller and a sound generating component; wherein,
    the housing comprises at least one supporting component, configured to support the lollipop; and
    the controller is configured to drive the sound generating component to generate a vibration signal according to an opening instruction received by the trigger, or when the trigger determines that the lollipop enters an oral cavity of an object to be sounded or touches teeth, to transmit the vibration signal to an auditory system of the object to be sounded through the at least one supporting component and the lollipop;
    wherein the sound generating component comprises an external structure and at least one energy conversion unit accommodated in the external structure;
    wherein the controller is specifically configured to drive all or part of the energy conversion unit in the sound generating component to generate the vibration signal according to a type of an acquired sound source and a frequency response range corresponding to the energy conversion device.

2. The bone conduction based sound generating lollipop according to claim 1, wherein the trigger comprises a sensor;
    then the controller is specifically configured to trigger the sound generating component to generate the vibration signal when the sensor determines that the lollipop enters a human oral cavity.

3. The bone conduction based sound generating lollipop according to claim 2, wherein the sensor comprises a pressure sensor, then the controller is specifically configured to trigger the sound generating component to generate the vibration signal according to a pressure change generated by touching the lollipop sensed by the pressure sensor.

4. The bone conduction based sound generating lollipop according to claim 2, wherein the sensor comprises a light sensor, then the controller is specifically configured to trigger the sound generating component to generate the vibration signal according to a light change around the lollipop sensed by the light sensor.

5. The bone conduction based sound generating lollipop according to claim 2, wherein the sensor comprises one or more of the following: a temperature sensor, a humidity sensor and a capacitance sensor, then the controller is specifically configured to trigger the sound generating component to generate the vibration signal according to at least one of a temperature, humidity and capacitance change around the lollipop sensed by at least one of the temperature sensor, humidity sensor and capacitance sensor.

6. The bone conduction based sound generating lollipop according to claim 3, wherein the controller is further configured to perform operation on a sound source using an operation mode corresponding to a preset times when the pressure sensor recognizes that times of teeth of the human oral cavity touching the lollipop within a preset interval range reaches the preset time.

7. The bone conduction based sound generating lollipop according to claim 6, wherein the operation mode comprises one or more of the following:
    a fast forward operation, a fast backward operation, an operation of skipping to next audio program, an operation of skipping to previous audio program, an operation of reducing preset volume and an operation of increasing preset volume.

8. The bone conduction based sound generating lollipop according to claim 3, wherein the controller is further configured to reduce a volume of a sound source when the pressure sensor recognizes that a pressure change range of touching the lollipop is greater than a preset threshold range.

9. The bone conduction based sound generating lollipop according to claim 1, further comprising a timer;
then the controller is further configured to record a time of the lollipop in the oral cavity using the timer when the lollipop is determined to enter a human oral cavity; and
the controller is further configured to determine a melting degree of the lollipop according to the time of the lollipop in the oral cavity recorded by the timer, and adjust a volume of a sound source according to the melting degree.

10. The bone conduction based sound generating lollipop according to claim 1, wherein the housing further comprises a handle shaped component, and the handle shaped component is connected with the supporting component;
the sound generating component is arranged in the supporting component, and the controller is arranged in the handle shaped component.

11. The bone conduction based sound generating lollipop according to claim 10, wherein the handle shaped component comprises a connecting section, a system section and a sound leak-proof structure or a sound leak-proof material attached to an inner cavity wall of the handle shaped component; wherein,
one end of the connecting section is connected with the supporting component, and the other end is connected with the system section; and the controller is arranged in the system section.

12. The bone conduction based sound generating lollipop according to claim 1, wherein the energy conversion unit comprises an electric receiving element connected to the external structure and a vibration element within an action range of the electric receiving element.

13. The bone conduction based sound generating lollipop according to claim 12, wherein when there is at least one energy conversion unit:
the electric receiving element in each energy conversion unit comprises a first magnetic body, and the vibration element comprises one second magnetic body or two second magnetic bodies;
or,
the electric receiving element in each energy conversion units comprises two first magnetic bodies, and the vibration element comprises one second magnetic body.

14. The bone conduction based sound generating lollipop according to claim 13, wherein the first magnetic body or the second magnetic body comprises at least one of at least one magnet and at least one coil.

15. The bone conduction based sound generating lollipop according to claim 13, wherein the energy conversion unit further comprises an elastic element, configured to implement a connection between the electric receiving element and the vibration element.

16. The bone conduction based sound generating lollipop according to claim 12, wherein when there is at least one energy conversion unit, the electric receiving element in each energy conversion unit comprises a vibration diaphragm, and the vibration element comprises at least one piezoelectric sheet.

17. The bone conduction based sound generating lollipop according to claim 16, wherein for each energy conversion unit, one piezoelectric sheet is attached to a middle of the vibration diaphragm, and the other piezoelectric sheets are respectively attached to sides of the vibration diaphragm.

18. The bone conduction based sound generating lollipop according to claim 1, wherein when there is at least two energy conversion units, the external structure is further provided with at least two accommodating cavities, so that each of the accommodating cavities accommodates one of the energy conversion units.

19. The bone conduction based sound generating lollipop according to claim 1, wherein the frequency response range corresponding to each energy conversion unit is different.

20. The bone conduction based sound generating lollipop according to claim 1, wherein each energy conversion unit comprises at least one different frequency response range.

21. The bone conduction based sound generating lollipop according to claim 1, wherein the trigger comprises a switching element, then the controller is specifically configured to determine that the opening instruction is received according to an opening of the switching element, to trigger the sound generating element to generate the vibration signal.

22. The bone conduction based sound generating lollipop according to claim 1, further comprising a power supplier, configured to perform a power supply processing to the controller and the sound generating component.

23. The bone conduction based sound generating lollipop according to claim 1, further comprising:
at least one indicator light;
then the controller is specifically configured to start the at least one indicator light while the controller triggers the sound generating component to generate the vibration signal.

24. The bone conduction based sound generating lollipop according to claim 1, further comprising at least one light-emitting apparatus;
then the controller is specifically configured to trigger the at least one light-emitting apparatus to emit light with at least one of color and light intensity according to at least one of a type of a sound source and a strength of the vibration signal.

25. The bone conduction based sound generating lollipop according to claim 1, further comprising a memory, configured to store sound source data.

26. The bone conduction based sound generating lollipop according to claim 1, further comprising a data input interface, configured to receive a sound source sent by an external device in at least one of a wired and wireless manner.

27. The bone conduction based sound generating lollipop according to claim 1, wherein the data input interface further comprises at least one of Universal Serial Bus, USB, interface, external Serial Advanced Technology Attachment, eSATA, interface, Secure Digital, SD, card interface, Micro SD card interface, audio input interface, video input interface, Wi-Fi interface, Bluetooth interface, metal electrode and microphone.

28. The bone conduction based sound generating lollipop according to claim 1, further comprising a recognition chip, configured to establish a communication connection with an external device, and perform a verification interaction processing with the external device.

29. A bone conduction based sound generating lollipop system, comprising the bone conduction based sound generating lollipop according to claim 1, and a device carries the bone conduction based sound generating lollipop.

30. The bone conduction based sound generating lollipop system according to claim 29, wherein the device comprises an accommodating box for accommodating the bone conduction based sound generating lollipop, a transmission apparatus for transmitting the bone conduction based sound generating lollipop arranged inside the accommodating box, an outlet arranged in an external side of the accommodating box, a control apparatus arranged inside the accommodating box and a display screen arranged in the external side of the accommodating box for interaction;
    then the control apparatus is configured to trigger the transmission apparatus to take out the bone conduction based sound generating lollipop matched with a lollipop request instruction from the accommodating box when obtaining the lollipop request instruction based on the display screen for interaction, and transmit the matched bone conduction based sound generating lollipop to the outlet.

31. The bone conduction based sound generating lollipop system according to claim 29, wherein the device comprises an accommodating box for accommodating the bone conduction based sound generating lollipop, a transmission apparatus for transmitting the bone conduction based sound generating lollipop arranged inside the accommodating box, an outlet arranged in an external side of the accommodating box, a control apparatus arranged inside the accommodating box, and an operating lever apparatus for interaction;
    then the control apparatus is configured to trigger the transmission apparatus to take out the bone conduction based sound generating lollipop matched with a lollipop request instruction from the accommodating box when obtaining the lollipop request instruction based on the operating lever apparatus for interaction, and transmit the matched bone conduction based sound generating lollipop to the outlet.

32. The bone conduction based sound generating lollipop system according to claim 29, wherein the device further comprises a burning apparatus, and then the control apparatus is specifically configured to burn information to be burned in an acquired information burning request into a memory of the bone conduction based sound generating lollipop according to the information burning request.

33. The bone conduction based sound generating lollipop system according to claim 32, wherein the information to be burned comprises one or a combination of several of the following: music to be burned, voice to be burned, and electronic ticket to be burned.

34. A bone conduction based sound generating lollipop processing method, wherein the method is applied to the bone conduction based sound generating lollipop according to claim 1, the method comprises:
    receiving, by a controller, an opening instruction through a trigger, or determining whether the lollipop enters an oral cavity or touches teeth of an object to be sounded through the trigger; and
    driving, by the controller, a sound generating component to generate a vibration signal when the controller determines that the opening instruction is received, or determines that the lollipop enters the oral cavity or touches the teeth of the object to be sounded through the trigger, to transmit the vibration signal to an auditory system of the object to be sounded through at least one supporting component and the lollipop.

35. The bone conduction based sound generating lollipop processing method according to claim 34, wherein the controller triggers the sound generating component to generate the vibration signal when the sensor determines that the lollipop enters a human oral cavity.

36. The bone conduction based sound generating lollipop processing method according to claim 35, when the sensor comprises a pressure sensor, the controller triggers the sound generating component to generate the vibration signal according to a pressure change generated by touching the lollipop sensed by the pressure sensor.

37. The bone conduction based sound generating lollipop processing method according to claim 35, wherein when the sensor comprises a light sensor, the controller triggers the sound generating component to generate the vibration signal according to a light change around the lollipop sensed by the light sensor.

38. The bone conduction based sound generating lollipop processing method according to claim 35, wherein when the sensor comprises one or more of the following: a temperature sensor, a humidity sensor and a capacitance sensor, the controller triggers the sound generating component to generate the vibration signal according to at least one of a temperature, humidity and capacitance change around the lollipop sensed by at least one of the temperature, humidity and capacitance sensor.

39. The bone conduction based sound generating lollipop processing method according to claim 36, wherein the controller operates a sound source using an operation mode corresponding to a preset times, when the times of touching the lollipop by the teeth in the human oral cavity touch within a preset interval range reaches the preset time sensed by the pressure sensor.

40. The bone conduction based sound generating lollipop processing method according to claim 39, wherein the operation mode comprises one or more of the following:
    a fast forward operation, a fast backward operation, an operation of skipping to next audio program, an operation of skipping to previous audio program, an operation of reducing preset volume and an operation of increasing preset volume.

41. The bone conduction based sound generating lollipop processing method according to claim 36, wherein the controller reduces a volume of a sound source when the pressure sensor recognizes that a pressure change range of touching the lollipop is greater than a preset threshold range.

42. The bone conduction based sound generating lollipop processing method according to claim 34, wherein, the method further comprises:
    recording, by the controller, a time of the lollipop in the oral cavity using the timer when the lollipop is determined to enter a human oral cavity; and
    determining, by the controller, a melting degree of the lollipop according to the time of the lollipop in the oral cavity recorded by the timer, and adjusting a volume of a sound source according to the melting degree.

* * * * *